United States Patent [19]

Christensen

[11] Patent Number: 4,789,809
[45] Date of Patent: Dec. 6, 1988

[54] HIGH FREQUENCY DISCHARGE APPARATUS WITH IMPEDANCE MATCHING

[75] Inventor: C. Paul Christensen, Washington, D.C.

[73] Assignee: Potomac Photonics, Inc., College Park, Md.

[21] Appl. No.: 28,111

[22] Filed: Mar. 19, 1987

[51] Int. Cl.$^4$ .......................... H01J 15/04; H03H 7/38
[52] U.S. Cl. ............................... 315/39; 315/111.41; 315/248; 333/35; 333/99 PL
[58] Field of Search ................. 333/99 PL, 263, 33, 333/35, 13; 315/39, 111.81, 111.71, 111.91, 111.41, 248; 328/216

[56] References Cited

U.S. PATENT DOCUMENTS

| | | | |
|---|---|---|---|
| 2,760,163 | 8/1956 | Arditi | 333/99 PL |
| 2,798,186 | 7/1957 | Caithness | 315/39 |
| 3,621,463 | 11/1971 | Olson, Jr. | 333/235 X |
| 4,472,690 | 9/1984 | Hallford | 333/35 |
| 4,631,732 | 12/1986 | Christensen | 372/64 X |

Primary Examiner—Eugene R. Laroche
Assistant Examiner—Benny Lee
Attorney, Agent, or Firm—Wegner & Bretschneider

[57] ABSTRACT

In a high-frequency discharge apparatus utilizing a discharge tube positioned between an electrode and a ground plane, the electrode is shaped so as to increase the uniformity of the electric field across the discharge tube. Furthermore, a transmission line is formed between a conductor connected to the electrode and the ground plane, and impedance matching in the transmission line is provided by metal and/or dielectric tuning slugs inserted between the conductor and the ground plane.

14 Claims, 3 Drawing Sheets

HIGH FREQUENCY DISCHARGE APPARATUS WITH IMPEDANCE MATCHING

BACKGROUND OF THE INVENTION

1. Field of the Invention

This invention relates to the contruction and operation of gas discharge devices excited with high freqency (200 MHz to 10 GHz) electromagnetic fields of the type often used for excitation of lasers or chemical processing of solid surfaces. The invention relates to a transmission line and electrode arrangement for enabling efficient delivery of high frequency electrical power to a gas discharge plasma contained in a dielectric tube.

2. Object of the Invention

An object of the invention is to provide a compact device for efficient delivery of high frequency power from an R-F source to the discharge plasma with minimal electrical reflection due to impedance mismatch.

A second object of the invention is to provide a device which is easily tuned to compensate for changes in electrical impedance of the discharge.

A third object of the invention is to provide a plasma excitation circuit that is capable of withstanding high electrical fields.

A fourth object of the invention is to provide an electrode structure which creates a spatially uniform field in the discharge plasma.

A fifth object of the invention is to provide a means for electrically isolating low frequency electric fields which may be used for discharge initiation from the high frequency power source.

3. Description of Prior Art

Much of the prior art has emerged in the course of development of gas discharge laser and semiconductor processing technologies. Electrical circuits for excitation of gas discharge lasers by radio frequency fields have been described by Laakmann in U.S. Pat. No. 4,169,251, LaChambre, et al., Applied Physics Letters, 32(10), p. 652, May 15, 1978, and Christensen and Waynant, Applied Physics Letters 41(9), p. 794, Nov. 1, 1982, These circuits utilize lumped circuit elements for impedance matching and are not suitable for operation at frequencies in excess of approximately 200 MHz. Hollow rectangular waveguide configurations for delivery of microwave power to plasmas contained in dielectric tubes have been described by Kikuchi in U.S. Pat. No. 4,004,249 and Wynant, et al., in U.S. Pat. No. 4,413,414. These systems are extremely cumbersome and do not address the issue of matching the discharge impedance to the generator impedance for efficient power delivery. Christensen, in U.S. Pat. No. 4,631,732 has described a laser utilizing a gas discharge tube positioned between a transmission line electrode and a ground plane but again has not described external circuit elements for impedance matching or the use of specially shaped electrodes to enhance discharge uniformity.

BRIEF SUMMARY

This invention utilizes a high-frequency electric field to excite a gaseous plasma contained in a discharge tube inserted between an electrically conducting electrode and a ground plane. The electrode may be specially shaped to enhance electric field uniformity in the discharge plasma. The electrode is conductively or capacitively connected to a conductor that is positioned over the same ground plane to form a transmission line for delivery of high frequency power from the generator to the discharge. Impedance matching is accomplished by positioning two quarter wavelength slugs fabricated from metal and/or dielectric materials between the transmission line conductor and the ground plane to decrease the characteristic impedance of the transmission line in their vacinity. A thin sheet of dielectric material may be inserted between the discharge electrode and the transmission line conductor when it is desirable to apply low frequency (0–50 MHz) voltages to the discharge electrode for discharge control and simultaneously isolate these voltages from the high frequency generator.

DESCRIPTION OF THE PREFERRED EMBODIMENT

Figure 1A:
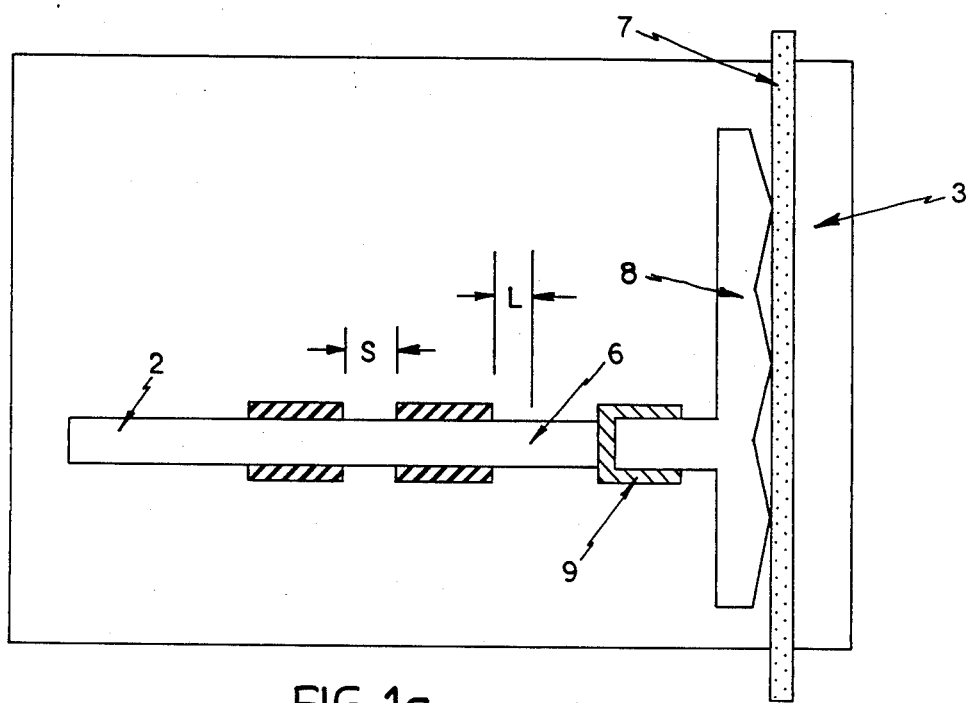
In FIG. 1 there is shown a simplified sketch of the top view and side view of one embodiment of the high-frequency excitation apparatus.
Figure 1B:
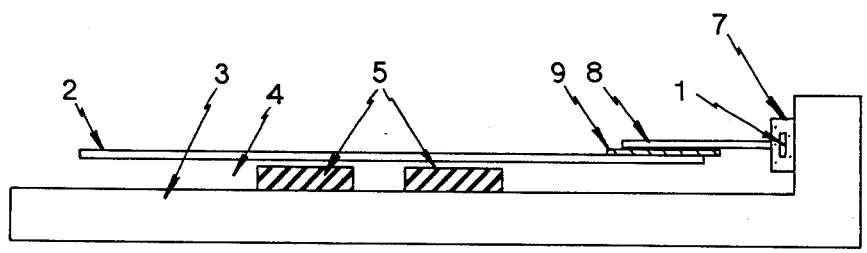

The principal features of construction of the microwave system are shown in FIG. 1. During operation of a high-power high-frequency (200 MHz to 10 GHz) electrical wave is guided to the discharge region 1 by the transmission line formed by conductor 2 and ground plane 3. The characteristic impedance of this line is primarily determined by the width of the conductor and its separation from the ground plane, and the dielectric constant of the material 4 in the high-field region between the conductor and ground plane. Insertion of tuning slugs 5 constructed from materials with dielectric constant different from that of metal and/or dielectric material 4 between the conductor and ground plane perturbs the characteristic impedance of the transmission line and produces an impedance transforming effect as the electrical wave traverses the portion of the transmission line occupied by the tuning slugs. If the electrical length of the slugs is one quarter of the electrical wavelength the two slugs together form an impedance transforming device known in the art of microwave engineering as a double slug tuner. The magnitude of the effective impedance of the microwave source at an arbitrary position 6 on the transmission line can be varied by adjusting the slug separation, S, and the phase of the effective source impedance at arbitrary position 6 can be adjusted by changing the length, L. Consequently the effective impedance of the generator at point 6 can be adjusted to be the complex conjugate of the impedance presented by the discharge at 6 providing completely efficient transfer of power from the generating to the discharge.

Uniform excitation of the discharge plasma along the length of the discharge tube 7 requires that the electric field in the region occupied by the discharge tube also be relatively uniform. The electric field at any point along the length of the electrode 8 is proportional to the voltage on the electrode 8 at that point and approximately inversely proportional to separation between the electrode 8 and the groud plane 3 at that point. If the length of the electrode 8 is greater than approximately ⅛ of the wavelength of the applied electric field, standing wave effects are likely to cause variation of the local electrode voltage along its length of the electrode. This voltage variation will result in nonuniform excitation of the plasma if the separation between the electrode 8 and ground plane 3 is constant. However, by shaping the electrode 8 so that the separation between the electrode and ground plate 3 increases in regions where the local electrode voltage is high and decreases in regions where the electrode voltage is low, power deposition into the plasma can be maintained at a relatively uniform level along the portion of the discharge tube 7 lying between the electrode 8 and the ground plane 3. The voltage variation is first measured and then the electrode 8 is shaped to compensate for the variance due to the standing wave. The electrode distance to the tube 7 is therefore proportioned to the voltage.

It is well known in the gas discharge are that application of a high-voltage pulse to the discharge electrode prior to excitation by high-frequency fields effects preionization of the gas and assures effective delivery of the high-frequency electrical power to the discharge plasma. This pulse may be applied by means of a conductor bonded or otherwise attached to the electrode 8. Since the high-voltage preionization pulse can damage the high-frequency generator and associated circuitry, and the high-frequency circuitry can interfere with proper delivery of the high-voltage pulse to the electrode it is desirable to electrically isolate the high-frequency portion of the excitation system from the electrode by inserting a suitable capacitor between the electrode 8 and the transmission line conductor 2. An appropriate capacitor can be formed by placing a dielectric sheet 9 between electrode 8 and conductor 2. The dielectric material 9 should exhibit low loss at the excitation frequency utilized and sufficient dielectric strength and thickness to withstand the electric fields produced by the discharge control pulse.

Figure 2A:
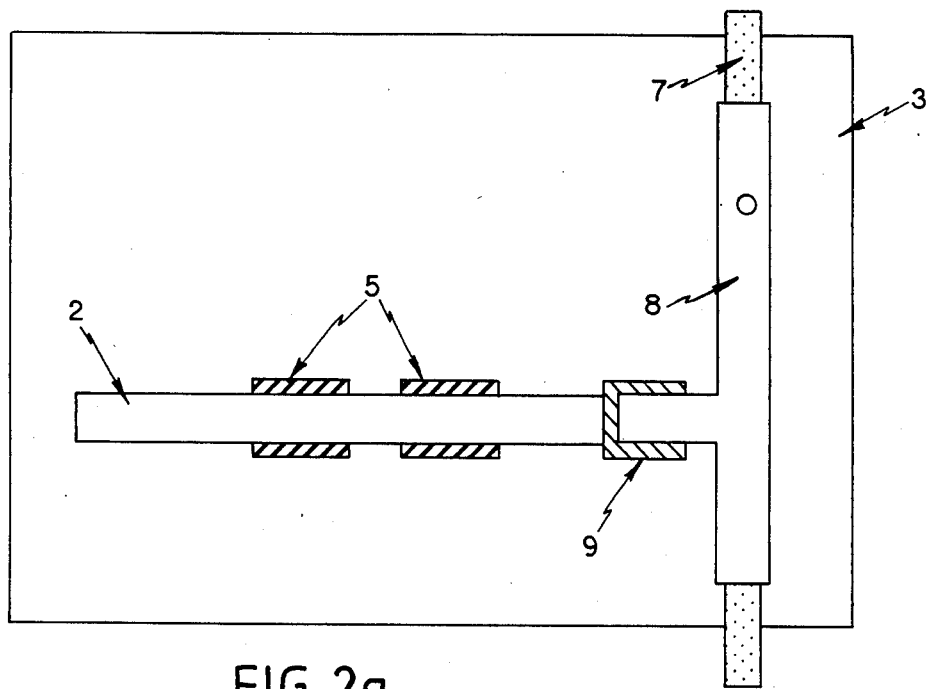
FIG. 2 shows another embodiment of the high-frequency excitation apparatus in which provision is made for mounting the discharge tube in a manner that allows use of a flat ground plane.
Figure 2B:
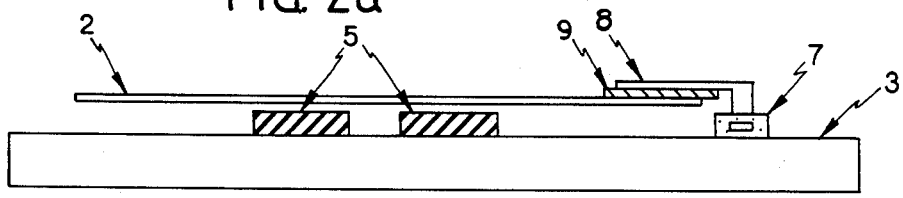
Figure 2C:
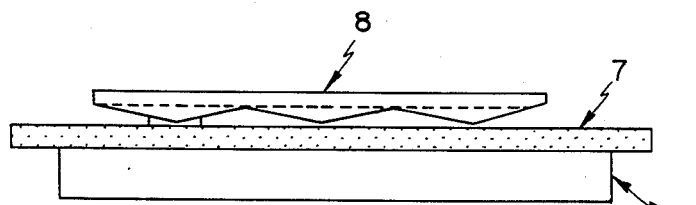

FIG. 2 shows a variation of the embodiment of FIG. 1, wherein the ground plane 3 is formed as a flat sheet and the electrode 8 extends above the discharge tube 7. The operation of the apparatus of FIG. 2 is the same as that of FIG. 1.

Figure 3:
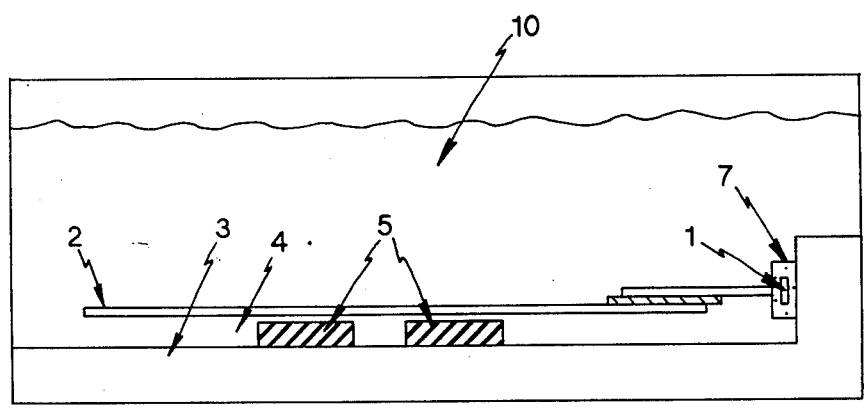
FIG. 3 shows a side view of the apparatus of FIG. 1 immersed in a non-conducting fluid.

FIG. 3 shows the apparatus of FIG. 1 immersed in a nonconducting fluid 10.

I claim:

1. A microwave discharge apparatus, comprising:
a ground plane,
a discharge electrode having a longitudinal axis substantially parallel to the ground plane,
a dielectric discharge tube positioned between said electrode and said ground plane,
a conductive strip electrically contacting said electrode and positioned parallel to said ground plane, thus forming a transmission line conductor, and
two dielectric slugs of approximately one quarter wave electrical length each, positioned between said transmission line conductor and said ground plane.

2. The apparatus of claim 1 wherein a microwave electric field is produced between said electrode and said ground plane by an electrode voltage, and said dielectric discharge tube is spaced from said electrode a distance which is proportional to the electrode voltage.

3. A microwave discharge apparatus, comprising:
a ground plane,
a discharge electrode having a longitudinal axis substantially parallel to the ground plane,
a dielectric discharge tube positioned between said electrode and said ground plane,
a conductive strip electrically contacting said electrode and positioned parallel to said ground plane, thus forming a transmission line conductor, and
two dielectric slugs of approximately one quarter wave electrical length each, positioned between said transmission line conductor and said ground plane,
wherein microwave power is capacitatively coupled from said transmission line conductor to said discharge electrode without direct electrical contact between said electrode and said conductor.

4. The apparatus of claim 3 further comprising a dielectric sheet inserted between said discharge electrode and said transmission line conductor to create said capacitative coupling.

5. The apparatus of claim 3 further including provision for applying low frequency voltages to said discharge electrode at frequencies substantially lower than the microwave frequency.

6. The apparatus of claim 3 wherein said dielectric slugs are constructed to include electrically conducting material.

7. The apparatus of claim 3 wherein the apparatus is immersed in a nonconducting fluid.

8. A microwave discharge apparatus, comprising:
a ground plane,
a discharge electrode having a longitudinal axis substantially parallel to the ground plane,
a dielectric discharge tube positioned between said electrode and said ground plane,
a conductive strip electrically contacting said electrode and positioned parallel to said ground plane, thus forming a transmission line conductor, and
two dielectric slugs of approximately one quarter wave electrical length each, positioned between siad transmission line conductor and said ground plane,
wherein a microwave electric field is produced between the electrode and the ground plane, and said discharge electrode has an edge, the shape of which is determined so as to increase uniformity of the microwave electric field produced between said discharge electrode and said ground plane.

9. The apparatus of claim 8 wherein the microwave electric field is produced by an electrode voltage, and said dielectric discharge tube is spaced from said electrode a distance which is proportional to the electrode voltage.

10. A microwave discharge apparatus, comprising:
a ground plane,
a discharge electrode having a longitudinal axis substantially parallel to the ground plane,
a dielectric discharge tube positioned between said electrode and said ground plane,
a conductive strip electrically contacting said electrode and positioned parallel to said ground plane, thus forming a transmission line conductor, and
two dielectric slugs of approximately one quarter wave electrical length each, positioned between said transmission line conductor and said ground plane,
wherein a microwave electric field is produced between the electrode and the ground plane, and said discharge electrode has an edge, the shape of which is determined so as to increase uniformity of the microwave electric field produced between said discharge electrode and said ground plane, and wherein microwave power is capacitatively coupled from said transmission line conductor to said discharge electrode without direct electrical contact between said electrode and said conductor.

11. The apparatus of claim 10 further comprising a dielectric sheet inserted between said discharge electrode and said transmission line conductor to create said capacitative coupling.

12. The apparatus of claim 10 further including provision for applying low frequency voltages to said discharge electrode at frequencies substantially lower than the microwave frequency.

13. The apparatus of claim 10 wherein said dielectric slugs are constructed to include electrically conducting material.

14. The apparatus of claim 10 wherein the apparatus is immersed in a nonconducting fluid.

* * * * *